US012642094B2

(12) United States Patent
Noh et al.

(10) Patent No.: US 12,642,094 B2
(45) Date of Patent: May 26, 2026

(54) SEMICONDUCTOR PACKAGE INCLUDING A PLURALITY OF HEAT DISSIPATION REINFORCEMENTS AND METHOD FOR FABRICATING SAME

(71) Applicant: SAMSUNG ELECTRONICS CO., LTD., Suwon-si (KR)

(72) Inventors: Hyunggyun Noh, Suwon-si (KR); Jinsoo Bae, Suwon-si (KR); Il-Joo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/201,466

(22) Filed: May 24, 2023

(65) Prior Publication Data

US 2024/0194563 A1      Jun. 13, 2024

(30) Foreign Application Priority Data

Dec. 8, 2022      (KR) ........................ 10-2022-0170804

(51) Int. Cl.
*H01L 23/433* (2006.01)
*H01L 21/56* (2006.01)
*H01L 23/00* (2006.01)

(52) U.S. Cl.
CPC .......... *H01L 23/4334* (2013.01); *H01L 21/56* (2013.01); *H01L 24/13* (2013.01); *H01L 24/16* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/13155*

(2013.01); *H01L 2224/13166* (2013.01); *H01L 2224/13184* (2013.01); *H01L 2224/16227* (2013.01)

(58) Field of Classification Search
CPC ............. H01L 23/4334; H01L 23/3128; H01L 23/367; H01L 21/56; H01L 21/4882; H01L 24/13; H01L 24/16; H01L 2224/13155; H01L 2224/13111; H01L 2224/13116; H01L 2224/13144; H01L 2224/16227; H01L 2224/13184; H01L 2224/13166; H01L 2224/13147; H01L 2224/13124

See application file for complete search history.

(56) References Cited

U.S. PATENT DOCUMENTS

| | | | |
|---|---|---|---|
| 7,808,098 B2 | 10/2010 | Sugiyama et al. | |
| 8,310,045 B2 | 11/2012 | Son | |
| 8,710,683 B2 | 4/2014 | Kim | |

(Continued)

FOREIGN PATENT DOCUMENTS

| | | |
|---|---|---|
| JP | 4086068 B2 | 5/2008 |
| KR | 10-1679657 B1 | 11/2016 |

*Primary Examiner* — Khiem D Nguyen

(74) *Attorney, Agent, or Firm* — Sughrue Mion, PLLC

(57) ABSTRACT

A semiconductor package includes: a substrate; a semiconductor chip provided on the substrate; a plurality of heat dissipation reinforcements provided on the substrate; and an encapsulant, on the substrate, molding the semiconductor chip and the plurality of heat dissipation reinforcements. Each of the plurality of heat dissipation reinforcements has an elongated shape, and extends along lateral surfaces and an upper surface of the semiconductor chip at a predetermined interval from the semiconductor chip.

20 Claims, 12 Drawing Sheets

100

(56)  References Cited

U.S. PATENT DOCUMENTS

| | | | |
|---|---|---|---|
| 10,636,678 B2 * | 4/2020 | Zhou | H01L 23/4334 |
| 10,825,800 B2 | 11/2020 | Kim et al. | |
| 11,049,787 B2 * | 6/2021 | Tada | H01L 25/18 |
| 11,421,073 B2 | 8/2022 | Won et al. | |
| 2005/0067689 A1 * | 3/2005 | Hedler | H01L 21/4853 |
| | | | 257/E23.024 |
| 2007/0097650 A1 * | 5/2007 | Fitzgerald | H01L 23/42 |
| | | | 257/E23.087 |
| 2008/0123300 A1 * | 5/2008 | Tian | H01L 23/3672 |
| | | | 361/721 |
| 2011/0304036 A1 * | 12/2011 | Son | H01L 23/3675 |
| | | | 257/693 |
| 2012/0074599 A1 | 3/2012 | Kim | |
| 2016/0005707 A1 * | 1/2016 | Kwon | H01L 24/11 |
| | | | 257/737 |
| 2021/0298203 A1 * | 9/2021 | Chung | H05K 5/0026 |
| 2022/0189849 A1 * | 6/2022 | Jeng | H01L 23/3736 |

* cited by examiner

<u>100</u>

100

100

<u>100</u>

130

SEMICONDUCTOR PACKAGE INCLUDING A PLURALITY OF HEAT DISSIPATION REINFORCEMENTS AND METHOD FOR FABRICATING SAME

CROSS-REFERENCE TO RELATED APPLICATION

This application claims priority to and the benefit of Korean Patent Application No. 10-2022-0170804 filed in the Korean Intellectual Property Office on Dec. 8, 2022, the entire contents of which are incorporated herein by reference.

BACKGROUND

1. Field

The disclosure relates to a semiconductor package and a method for fabricating the same.

2. Description of Related Art

In semiconductor industry fields, improvements are pursued in integration density so that more passive or active devices may be integrated in a given area. However, in the semiconductor industry fields, as technology development for miniaturizing a circuit line width in a front end semiconductor process gradually faces limitations, a semiconductor package, which protects a semiconductor chip on which an integrated circuit is formed, becomes lightweight, thin, miniaturized, high-speed, and multifunctional, and there is a trend to supplement the limitations at the front end semiconductor process by developing a semiconductor package with high integrated density.

As the semiconductor package becomes lightweight, thin, miniaturized, high-speed, and multifunctional, power consumed per unit volume of the semiconductor package further increases and a temperature inside the semiconductor package increases. When heat generated in the semiconductor package is not efficiently discharged in response to the increase in temperature of the semiconductor package, a difference in thermal stress may occur in the package structure, which may cause warpage in the package and slow down an operation speed of the semiconductor package, thereby causing problems with product reliability.

Therefore, it may be necessary to develop a new package technology that may improve these thermal characteristics.

SUMMARY

An embodiment has been made in an effort to provide a semiconductor package and a method for fabricating the same that may improve thermal characteristics, by adding a metal reinforcing material having high thermal conductivity to the inside of an epoxy molding compound (EMC), which is a material for molding a memory chip and each wire and which has low thermal conductivity.

According to an aspect of the disclosure, a semiconductor package includes: a substrate; a semiconductor chip provided on the substrate; a plurality of heat dissipation reinforcements provided on the substrate; and an encapsulant, on the substrate, molding the semiconductor chip and the plurality of heat dissipation reinforcements. Each of the plurality of heat dissipation reinforcements has an elongated shape, and extends along lateral surfaces and an upper surface of the semiconductor chip at a predetermined interval from the semiconductor chip.

According to another aspect of the disclosure, a semiconductor package includes: a substrate including an insulating layer and a conductive layer; a connecting member bonded to the conductive layer of the substrate; a semiconductor chip provided on the substrate and bonded to the connecting member; a plurality of heat dissipation reinforcements bonded to the insulating layer of the substrate; and an encapsulant, on the substrate, molding the connecting member, the semiconductor chip, and the plurality of heat dissipation reinforcements. Each of the plurality of heat dissipation reinforcements has an elongated shape, and extends along lateral surfaces and an upper surface of the semiconductor chip at a predetermined interval from the semiconductor chip.

According to another aspect of the disclosure, a method for fabricating a semiconductor package, includes: mounting a semiconductor chip on a substrate; forming, on the substrate, a plurality of heat dissipation reinforcements, the plurality of heat dissipation reinforcements extending along lateral surfaces and an upper surface of the semiconductor chip at a predetermined interval from the semiconductor chip and having an elongated shape; and molding the semiconductor chip and the plurality of heat dissipation reinforcements by using an encapsulant.

According to the embodiment, by forming metal reinforcing materials having various volumes and dispositions in an encapsulant (EMC) in a semiconductor package, heat generated in a semiconductor chip and each wire may be effectively transmitted and discharged to the outside, and thermal characteristics of the semiconductor package may be improved.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION OF EMBODIMENTS

Figure 1:
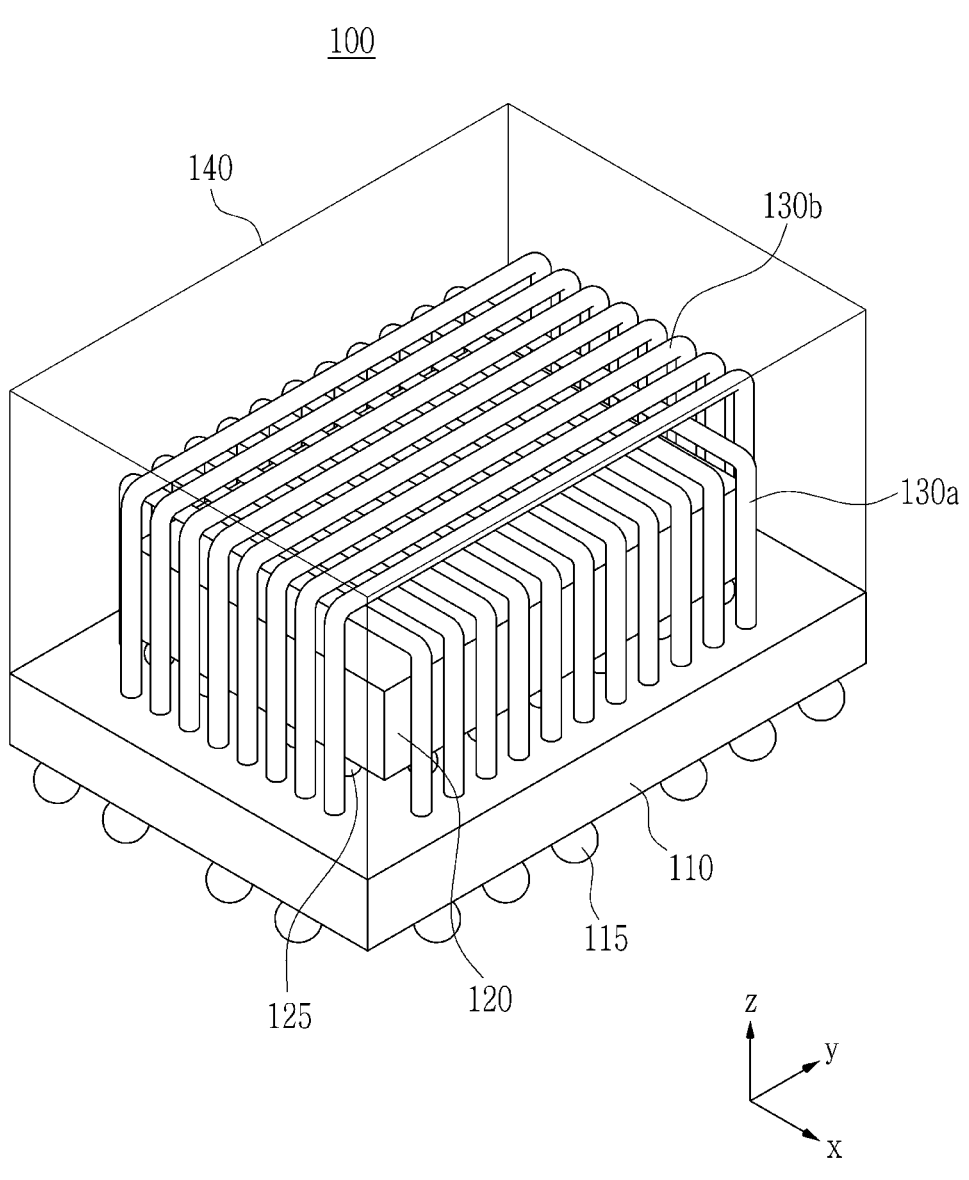
FIG. 1 illustrates a perspective view of a plurality of first heat dissipation reinforcements extending along lateral surfaces and an upper surface of a semiconductor chip in an encapsulant for molding the semiconductor chip on a substrate, and a plurality of second heat dissipation reinforcements extending along lateral surfaces and an upper surface of the semiconductor chip and arranged in a direction crossing a direction in which the plurality of first heat dissipation reinforcements are arranged, in a semiconductor package according to an embodiment.

The embodiments described herein are example embodiments, and thus, the disclosure is not limited thereto and may be realized in various other forms.

The disclosure will be described more fully hereinafter with reference to the accompanying drawings, in which embodiments are shown. As those skilled in the art would realize, the described embodiments may be modified in various different ways, all without departing from the spirit or scope of the disclosure.

The drawings and description are to be regarded as illustrative in nature and not restrictive. Like reference numerals designate like elements throughout the specification.

Further, in the drawings, the size and thickness of each element are arbitrarily illustrated for ease of description, and the present disclosure is not necessarily limited to those illustrated in the drawings.

Throughout this specification and the claims that follow, when it is described that an element is "coupled or connected" to another element, the element may be "directly coupled or connected" to the other element or "indirectly coupled or connected" to the other element through a third element. In addition, unless explicitly described to the contrary, the word "comprise" and variations such as "comprises" or "comprising" will be understood to imply the inclusion of stated elements but not the exclusion of any other elements.

As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a semiconductor package of an embodiment will be described with reference to the accompanying drawings.

FIG. 1 illustrates, in a semiconductor package 100 according to an embodiment, a perspective view of a plurality of first heat dissipation reinforcements 130a extending along lateral surfaces and an upper surface of a semiconductor chip 120 in an encapsulant 140 for molding the semiconductor chip 120 on a substrate 110, and a plurality of second heat dissipation reinforcements 130b extending along lateral surfaces and the upper surface of the semiconductor chip 120 and arranged in a direction crossing a direction in which the plurality of first heat dissipation reinforcements 130a are arranged.

Referring to FIG. 1, the semiconductor package 100 may include the substrate 110, the semiconductor chip 120, a connecting member 125, the plurality of heat dissipation reinforcements (the plurality of first heat dissipation reinforcements 130a and the plurality of second heat dissipation reinforcements 130b), and the encapsulant 140. In order to more efficiently dissipate heat from a semiconductor chip and various wires according to an increase in power consumed per unit volume in a light, thin, miniaturized, high-speed, and multi-functional semiconductor package, the semiconductor package 100 may include the plurality of heat dissipation reinforcements (the plurality of first heat dissipation reinforcements 130a and the plurality of second heat dissipation reinforcements 130b) surrounding the semiconductor chip 120 within the encapsulant 140. As an example, the semiconductor package 100 may include a wire bonding package, a redistribution layer (RDL) package, a flip chip package, a through silicon via (TSV) package, or a wafer level chip scale package (WLCSP).

The plurality of heat dissipation reinforcements (the plurality of first heat dissipation reinforcements 130a and the plurality of second heat dissipation reinforcements 130b) has higher thermal conductivity than the encapsulant 140. Therefore, when a volume fraction of the plurality of heat dissipation reinforcements (the plurality of first heat dissipation reinforcements 130a and the plurality of second heat dissipation reinforcements 130b) with respect to a volume of the encapsulant 140 is increased by including the plurality of heat dissipation reinforcements (the plurality of first heat dissipation reinforcements 130a and the plurality of second heat dissipation reinforcements 130b) in the encapsulant 140, thermal conductivity of the semiconductor package 100 is also increased and heat dissipation is smoothly performed, thereby improving thermal characteristics of the semiconductor package 100.

Although the plurality of first heat dissipation reinforcements 130a and the plurality of second heat dissipation reinforcements 130b are shown in FIG. 1 as an embodiment of the plurality of heat dissipation reinforcements, the number, disposition, or arrangement of the plurality of heat dissipation reinforcements is not limited thereto, the plurality of heat dissipation reinforcements may be included in a larger or smaller number, in a different disposition, or in a different arrangement within the volume of the encapsulant 140. In the embodiment, the semiconductor package 100 may include a plurality of third, fourth, . . . , and N-th heat dissipation reinforcements.

Figure 2:
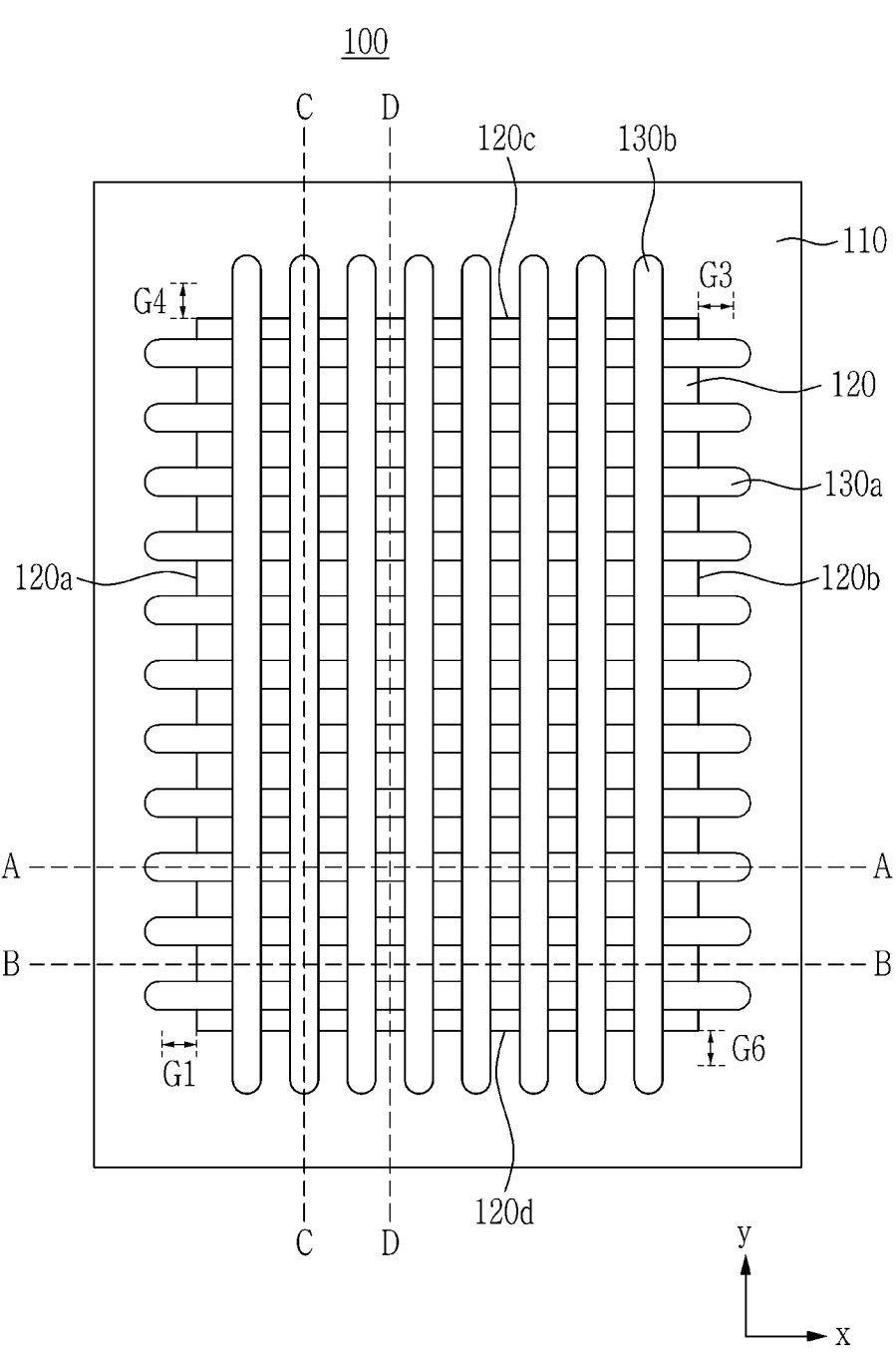
FIG. 2 illustrates a top plan view of a plurality of first heat dissipation reinforcements extending along an upper surface of a semiconductor chip in an encapsulant for molding the semiconductor chip on a substrate, and a plurality of second heat dissipation reinforcements extending along an upper surface of the semiconductor chip and arranged in a direction crossing a direction in which the plurality of first heat dissipation reinforcements are arranged in a semiconductor package according to an embodiment.

FIG. 2 illustrates, in a semiconductor package according to an embodiment, a top plan view of the plurality of first heat dissipation reinforcements 130a extending along the upper surface of the semiconductor chip 120 and the plurality of second heat dissipation reinforcements 130b extending along the upper surface of the semiconductor chip 120 and arranged in a direction crossing a direction in which the plurality of first heat dissipation reinforcements 130a are arranged.

Referring to FIG. 2, the semiconductor chip 120 may be disposed on the substrate 110, each of the plurality of first heat dissipation reinforcements 130a may extend in an X direction over the semiconductor chip 120, and each of the plurality of second heat dissipation reinforcements 130b may extend in a Y direction over the plurality of first heat dissipation reinforcements 130a. The plurality of first heat dissipation reinforcements 130a may have an extending direction crossing an extending direction of the plurality of second heat dissipation reinforcements 130b.

Figure 3:
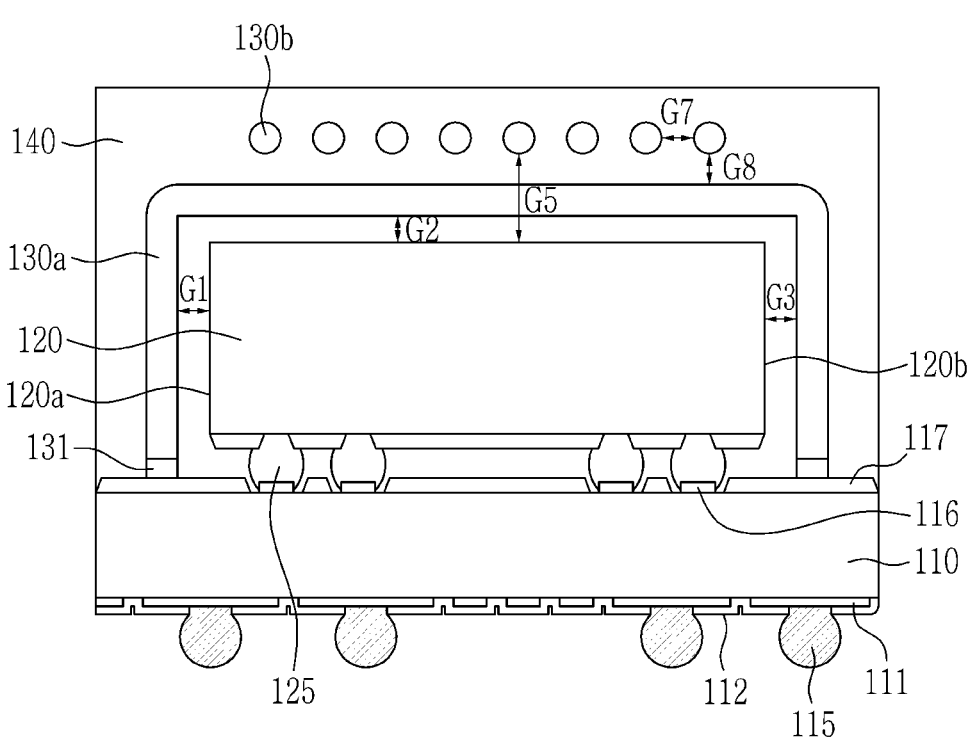
FIG. 3 illustrates a cross-sectional view taken along dotted line A-A in the top plan view of FIG. 2 in a semiconductor package according to an embodiment, and illustrates a cross-sectional view of a plurality of first heat dissipation reinforcements extending along lateral surfaces and an upper surface of the semiconductor chip in an encapsulant for molding the semiconductor chip on a substrate and a second heat dissipation reinforcement extending along the upper surface of the semiconductor chip and arranged in a direction crossing a direction in which the plurality of first heat dissipation reinforcements are arranged.

FIG. 3 illustrates, as a cross-sectional view taken along dotted line A-A in the top plan view of FIG. 2 in a semiconductor package according to an embodiment, a cross-sectional view of the plurality of first heat dissipation reinforcements 130a extending along lateral surfaces and an upper surface of the semiconductor chip 120 in the encapsulant 140 for molding the semiconductor chip 120 on the substrate 110 and the second heat dissipation reinforcement 130b extending along the upper surface of the semiconductor chip 120 and arranged in a direction crossing a direction in which the plurality of first heat dissipation reinforcements 130a are arranged.

Referring to FIG. 3, the semiconductor package 100 may include the substrate 110, an external connecting terminal 115, the semiconductor chip 120, the connecting member 125, the plurality of first heat dissipation reinforcements 130a, the plurality of second heat dissipation reinforcements 130b, an adhesive layer 131, and the encapsulant 140.

The substrate 110 may include metal pads 111 and an insulating layer 112 disposed on a lower surface of the substrate 110, and metal pads 116 and insulating layer 117 disposed on an upper surface of the substrate 110. As an example, the substrate 110 may include a rigid printed circuit board, a flexible printed circuit board, and a rigid-flexible printed circuit board. As another example, the substrate 110 may include a single-layer printed circuit board and a multi-layer printed circuit board. As another example, the substrate 110 may include an RDL Interposer substrate, an organic interposer substrate, and a silicon interposer substrate. As another example, the substrate 110 may include other substrates that may perform a molding process with an epoxy molding compound (EMC).

The metal pads 111 disposed on the lower surface of the substrate 110 may be bonded to the external connecting terminals 115 to electrically couple the substrate 110 and the external connecting terminals 115. The insulating layer 112 disposed on the lower surface of the substrate 110 may isolate each of the external connecting terminals 115. As an example, the metal pads 111 may include at least one of: copper, aluminum, tungsten, nickel, gold, tin, titanium, and an alloy thereof. As an example, the insulating layer 112 may be a solder resist.

The metal pads 116 disposed on the upper surface of the substrate 110 may be bonded to the connecting members 125 to electrically couple the substrate 110 and the connecting members 125. The insulating layer 117 disposed on the upper surface of the substrate 110 may isolate each of the connecting members 125. As an example, the metal pads 116 may include at least one of: copper, aluminum, tungsten, nickel, gold, tin, titanium, and an alloy thereof. As an example, the insulating layer 117 may be a solder resist.

The external connecting terminal 115 may electrically couple the metal pads 116 that are disposed on the lower surface of the substrate 110 to an external component. As an example, the external connecting terminal 115 may include solder. As an example, the external connecting terminal 115 may include tin (Sn) and lead (Pb).

The connecting member 125 may electrically couple the metal pads 116 disposed on the upper surface of the substrate 110 to the semiconductor chip 120. As an example, the connecting member 125 may include solder. As an example, the connecting member 125 may include tin (Sn) and lead (Pb). As another example, the connecting member 125 may include at least one of: copper, aluminum, tungsten, nickel, gold, tin, titanium, and an alloy thereof.

The semiconductor chip 120 may include other semiconductor chips such as a non-memory chip or a memory chip and a single or multi-chip.

The plurality of heat dissipation reinforcements may include the plurality of first heat dissipation reinforcements 130a and the plurality of second heat dissipation reinforcements 130b. The plurality of heat dissipation reinforcements (the plurality of first heat dissipation reinforcements 130a and the plurality of second heat dissipation reinforcements 130b) may be disposed on the insulating layer 117 of the substrate 110 by using the adhesive layer 131, and may be electrically insulated from wire lines of the substrate 110 and the semiconductor chip 120. As an example, the adhesive layer 131 may include an attach film. The plurality of heat dissipation reinforcements (the plurality of first heat dissipation reinforcements 130*a* and the plurality of second heat dissipation reinforcements 130*b*) may be disposed on a dummy metal pad of the substrate 110 by heat treatment, and may be electrically insulated from wire lines of the substrate 110 and the semiconductor chip 120. As an example, the plurality of heat dissipation reinforcements (the plurality of first heat dissipation reinforcements 130*a* and the plurality of second heat dissipation reinforcements 130*b*) may include copper, aluminum, gold, silver, iron, or stainless steel (SUS).

In FIG. 3, the plurality of first heat dissipation reinforcements 130*a* are shown as a cross-section of each of the first heat dissipation reinforcements cut in a longitudinal direction thereof, and the plurality of second heat dissipation reinforcements 130*b* is shown as a cross-section of each of the second heat dissipation reinforcements cut in a circumferential direction.

Referring to FIG. 3, the plurality of first heat dissipation reinforcements 130*a* may include a first area, at a predetermined first distance G1 from a first lateral surface 120*a* of the semiconductor chip 120, extending in a vertical direction (a Z direction) along the first lateral surface 120*a*; a second area, at a predetermined second distance G2 from an upper surface of the semiconductor chip 120, extending parallel to the upper surface (in the X direction); and a third area, at a predetermined third distance G3 from a second lateral surface 120*b* opposite to the first lateral surface 120*a* of the semiconductor chip 120, extending in a vertical direction (the Z direction) along the second lateral surface 120*b*.

The plurality of first heat dissipation reinforcements 130*a* may be arranged on the semiconductor chip 120 with the constant distance G2 from the semiconductor chip 120. The plurality of second heat dissipation reinforcements 130*b* may be arranged on the semiconductor chip 120 with a constant distance G5 from the semiconductor chip 120. The plurality of second heat dissipation reinforcements 130*b* may be arranged over the plurality of first heat dissipation reinforcements 130*a* with a constant distance G8 from the plurality of first heat dissipation reinforcements 130*a*. The plurality of first heat dissipation reinforcements 130*a* and the plurality of second heat dissipation reinforcements 130*b* may cross each other.

The encapsulant 140 may mold the semiconductor chip 120, the plurality of first heat dissipation reinforcements 130*a*, and the plurality of second heat dissipation reinforcements 130*b* on the substrate 110. As an example, the encapsulant 140 may include an epoxy molding compound (EMC).

Figure 4:
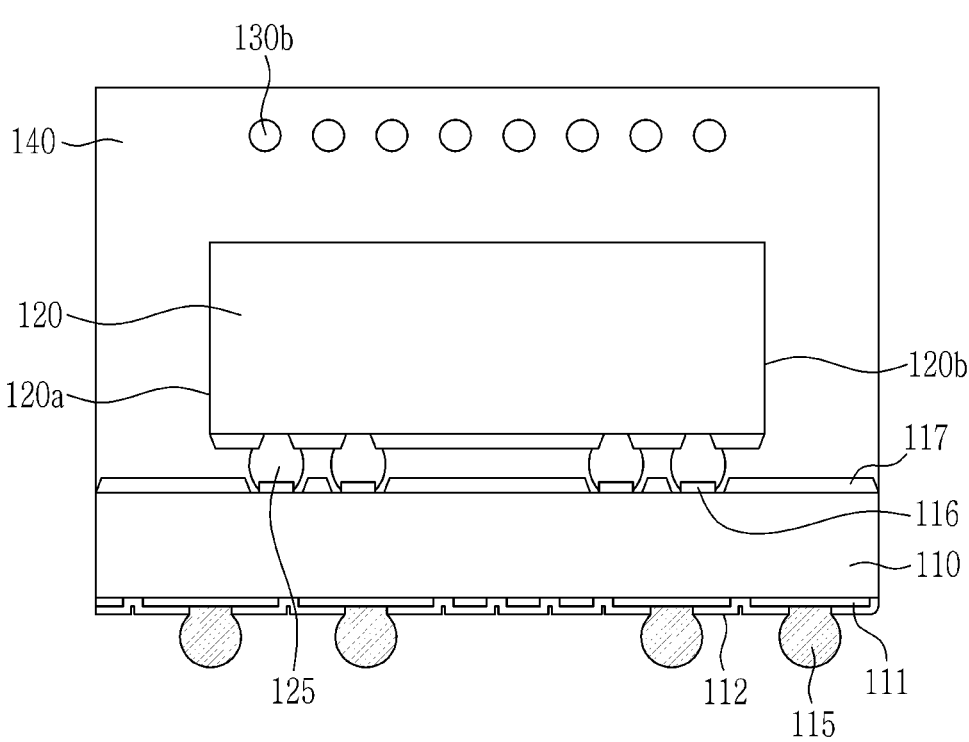
FIG. 4 illustrates a cross-sectional view taken along dotted line B-B in the top plan view of FIG. 2 in a semiconductor package according to an embodiment, and illustrates a cross-sectional view of a plurality of second heat dissipation reinforcements extending along an upper surface of the semiconductor chip in an encapsulant for molding the semiconductor chip on a substrate.

FIG. 4 illustrates, as a cross-sectional view taken along dotted line B-B in the top plan view of FIG. 2 in a semiconductor package according to an embodiment, a cross-sectional view of the plurality of second heat dissipation reinforcements 130*b* extending along the upper surface of the semiconductor chip 120 in the encapsulant 140 for molding the semiconductor chip 120 on the substrate 110.

Referring to FIG. 4, the semiconductor package 100 in which the plurality of first heat dissipation reinforcements 130*a* are excluded from the semiconductor package 100 of FIG. 3 is shown. Each of the plurality of first heat dissipation reinforcements 130*a* is arranged at a constant interval G9 (see FIG. 5) from the adjacent first heat dissipation reinforcements, in a cross-section taken along the dotted line B-B in the top plan view of FIG. 2.

Figure 5:
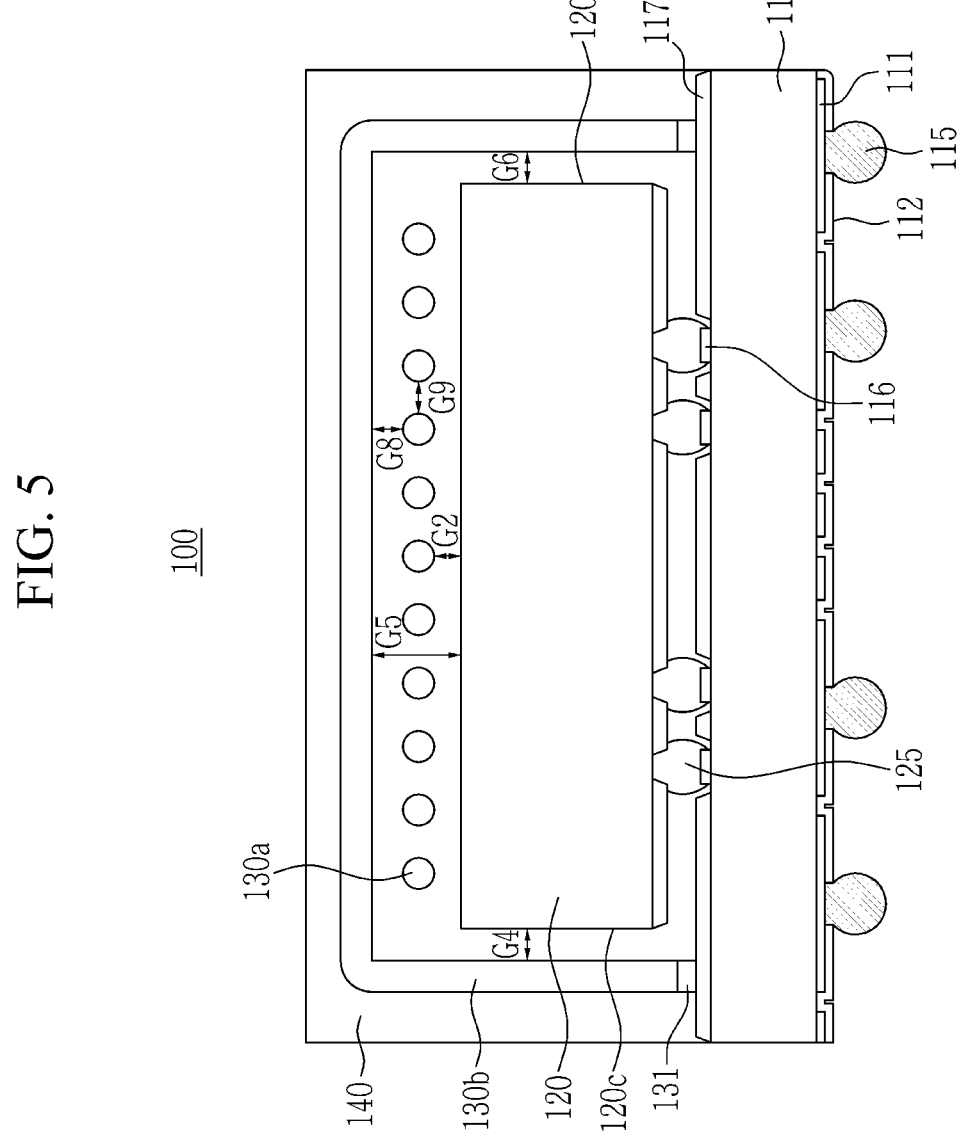
FIG. 5 illustrates a cross-sectional view taken along dotted line C-C in the top plan view of FIG. 2 in a semiconductor package according to an embodiment, and illustrates a cross-sectional view of a plurality of first heat dissipation reinforcements extending along an upper surface of the semiconductor chip in an encapsulant for molding the semiconductor chip on a substrate and a plurality of second heat dissipation reinforcements extending along lateral surfaces and the upper surface of the semiconductor chip and arranged in a direction crossing a direction in which the plurality of first heat dissipation reinforcements are arranged.

FIG. 5 illustrates, as a cross-sectional view taken along dotted line C-C in the top plan view of FIG. 2 in a semiconductor package according to an embodiment, a cross-sectional view of the plurality of first heat dissipation reinforcements 130*a* extending along the upper surface of the semiconductor chip 120 in the encapsulant 140 for molding the semiconductor chip 120 on the substrate 110 and the plurality of second heat dissipation reinforcements 130*b* extending along the lateral surfaces and the upper surface of the semiconductor chip 120 and arranged in the direction crossing the direction in which the plurality of first heat dissipation reinforcements 130*a* are arranged.

In FIG. 5, the plurality of first heat dissipation reinforcements 130*a* are shown as a cross-section of each of the first heat dissipation reinforcements cut in a circumferential direction thereof, and the plurality of second heat dissipation reinforcements 130*b* are shown as a cross-section of each of the second heat dissipation reinforcements cut in a longitudinal direction.

Referring to FIG. 5, the plurality of first heat dissipation reinforcements 130*a* may include a fourth area, at a predetermined fourth distance G4 from a third lateral surface 120*c* of the semiconductor chip 120, and extending in a vertical direction (the Z direction) along the third lateral surface 120*c*; a fifth area, at a predetermined fifth distance G5 from an upper surface of the semiconductor chip 120, and extending parallel to the upper surface (in the Y direction); and a sixth area, at a predetermined sixth distance G6 from a fourth lateral surface 120*d* opposite to the third lateral surface 120*c* of the semiconductor chip 120, and extending in a vertical direction (the Z direction) along the fourth lateral surface 120*d*.

Figure 6:
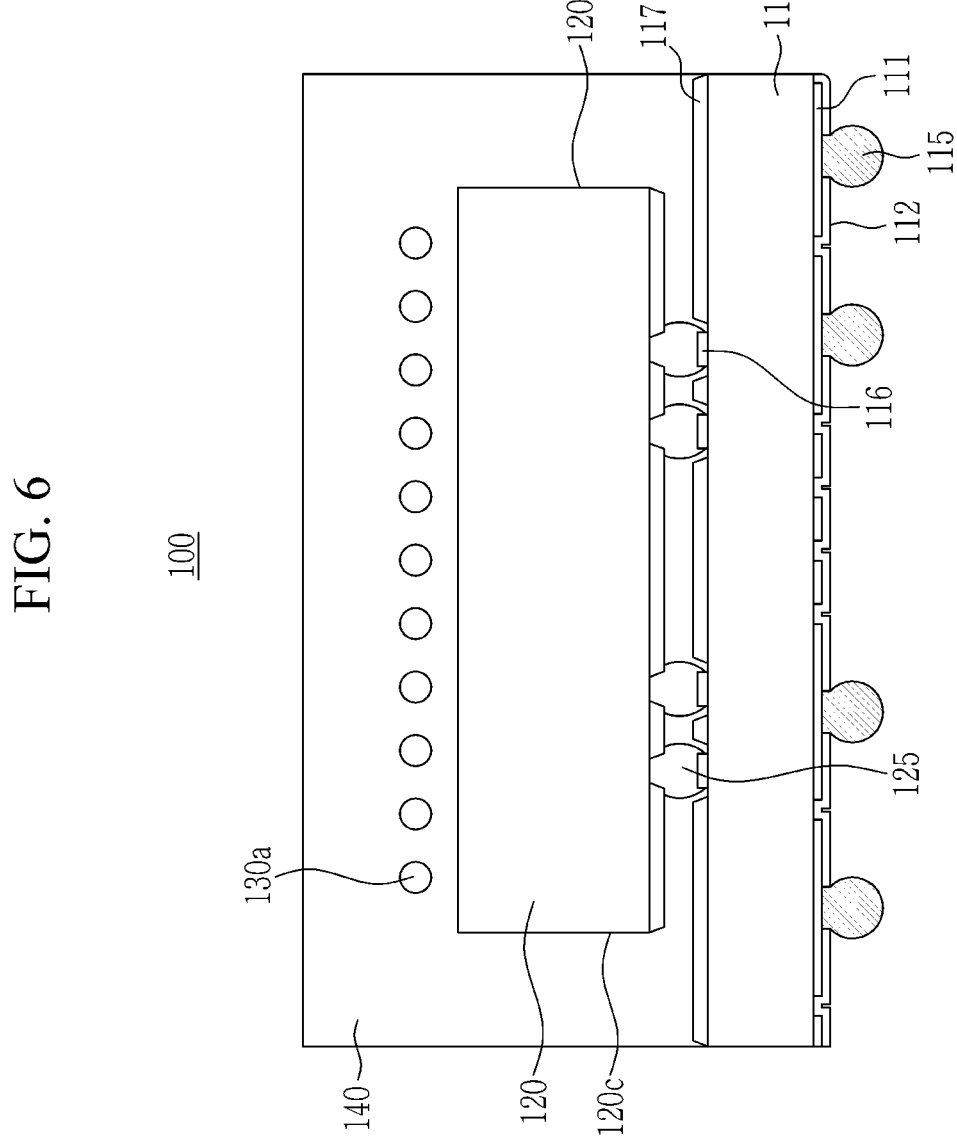
FIG. 6 illustrates a cross-sectional view taken along dotted line D-D in the top plan view of FIG. 2 in a semiconductor package according to an embodiment, and illustrates a cross-sectional view of a plurality of first heat dissipation reinforcements extending along an upper surface of the semiconductor chip in an encapsulant for molding the semiconductor chip on a substrate.

FIG. 6 illustrates, as a cross-sectional view taken along dotted line D-D in the top plan view of FIG. 2 in a semiconductor package according to an embodiment, and a cross-sectional view of the plurality of first heat dissipation reinforcements 130*a* extending along the upper surface of the semiconductor chip 120 in the encapsulant 140 for molding the semiconductor chip 120 on the substrate 110.

Referring to FIG. 6, the semiconductor package 100 in which the plurality of second heat dissipation reinforcements 130*b* are excluded from the semiconductor package 100 of FIG. 5 is shown. Each of the plurality of second heat dissipation reinforcements 130*b* is arranged at a constant interval G7 (see FIG. 3) from the adjacent second heat dissipation reinforcements, in a cross-section taken along the dotted line D-D in the top plan view of FIG. 2.

As an example, the interval G9 between the adjacent first heat dissipation reinforcements of the plurality of first heat dissipation reinforcements 130*a* may be 0.001 mm to 1000 mm. As an example, the interval G7 between the adjacent second heat dissipation reinforcements of the plurality of second heat dissipation reinforcements 130*b* may be 0.001 mm to 1000 mm. As an example, the interval G8 130*b* between each of the plurality of first heat dissipation reinforcements 130*a* and each of the plurality of second heat dissipation reinforcements 130*b* adjacent thereto may be 0.001 mm to 1000 mm. As an example, the intervals G1, G2, and G3 between each of the plurality of first heat dissipation reinforcements 130*a* and the semiconductor chip 120 may include 0.001 mm to 1000 mm. As an example, the intervals G4 and G6 between each of the plurality of second heat dissipation reinforcements 130*b* and the lateral surfaces (the third lateral surface 120*c* and the fourth lateral surface 120*d*) of the semiconductor chip 120 may be 0.001 mm to 1000 mm. As an example, the interval G5 between each of the plurality of second heat dissipation reinforcements 130*b* and the upper surface of the semiconductor chip 120 may have a length obtained by adding the interval G2 between each of the plurality of first heat dissipation reinforcements 130*a* and the semiconductor chip 120, the interval G8 between each of the plurality of first heat dissipation reinforcements 130*a* and each of the plurality of second heat dissipation reinforcements 130*b* adjacent thereto, and a width G10 of a cross-section obtained by cutting each of the plurality of first heat dissipation reinforcements 130*a* in a circumferential direction.

The plurality of heat dissipation reinforcements (the plurality of first heat dissipation reinforcements 130*a* and the plurality of second heat dissipation reinforcements 130*b*) included in the encapsulant 140 according to the present disclosure function as heat sinks that efficiently dissipate heat generated from the semiconductor chip 120 and each wire in the semiconductor package 100.

The thermal conductivity of the encapsulant formed of the epoxy molding compound (EMC) has a value of about 0.8 W/mK. The thermal conductivity of the encapsulant including the plurality of heat dissipation reinforcements has a value of about 2.2 to 6 W/mK depending on the volume and disposition of the plurality of heat dissipation reinforcements. Accordingly, compared to a semiconductor package in which a semiconductor chip is encapsulated with an encapsulant without a plurality of heat dissipation reinforcements, the semiconductor package in which the semiconductor chip is encapsulated with the encapsulant including the plurality of heat dissipation reinforcements may have higher thermal conductivity, and may efficiently dissipate heat generated from the semiconductor chip and each wire, so that the thermal characteristics of the semiconductor package may be improved.

Figure 7:
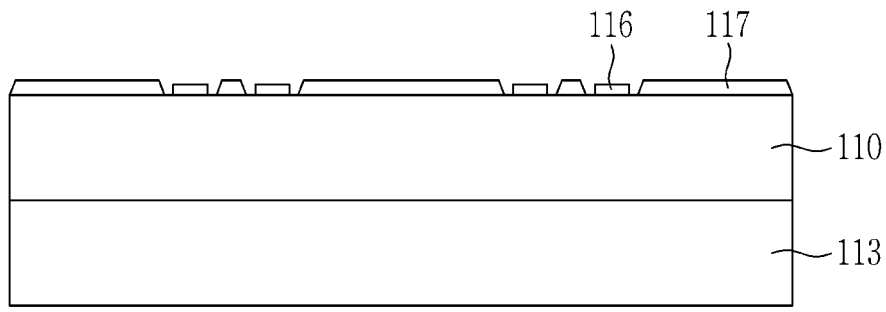
FIG. 7 illustrates a cross-sectional view of an operation of preparing a substrate, as one of operations of a method for fabricating a semiconductor package according to an embodiment.

FIG. 7 illustrates a cross-sectional view of an operation of preparing the substrate 110, as one of operations of a method for fabricating a semiconductor package according to an embodiment.

Referring to FIG. 7, the substrate 110 may be formed on a carrier 113. First, the carrier 113 is provided. In some embodiments, the carrier 113 includes, for example, a silicon-based material such as glass or a silicon oxide, an organic material, or another material such as an aluminum oxide, a combination of these materials, and the like. The substrate 110 is formed on the carrier 113. The metal pads 116 for connection to the connecting members 125 and the insulating layer 117 for isolating the connecting members 125 may be formed on the upper surface of the substrate 110.

Figure 8:
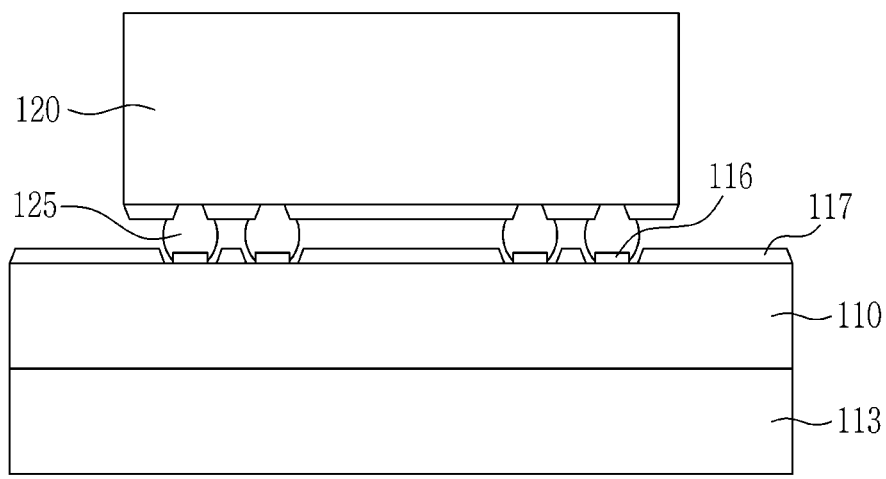
FIG. 8 illustrates a cross-sectional view of an operation of mounting a semiconductor chip on a substrate, as one of operations of a method for fabricating a semiconductor package according to an embodiment.

FIG. 8 illustrates a cross-sectional view of an operation of mounting the semiconductor chip 120 on the substrate 110, as one of operations of a method for fabricating a semiconductor package according to an embodiment.

Referring to FIG. 8, the semiconductor chip 120 may be mounted on the substrate 110. The semiconductor chip 120 may be bonded to the metal pads 116 disposed on the upper surface of the substrate 110 by the connecting member 125 formed on the lower surface of the semiconductor chip 120.

Figure 9:
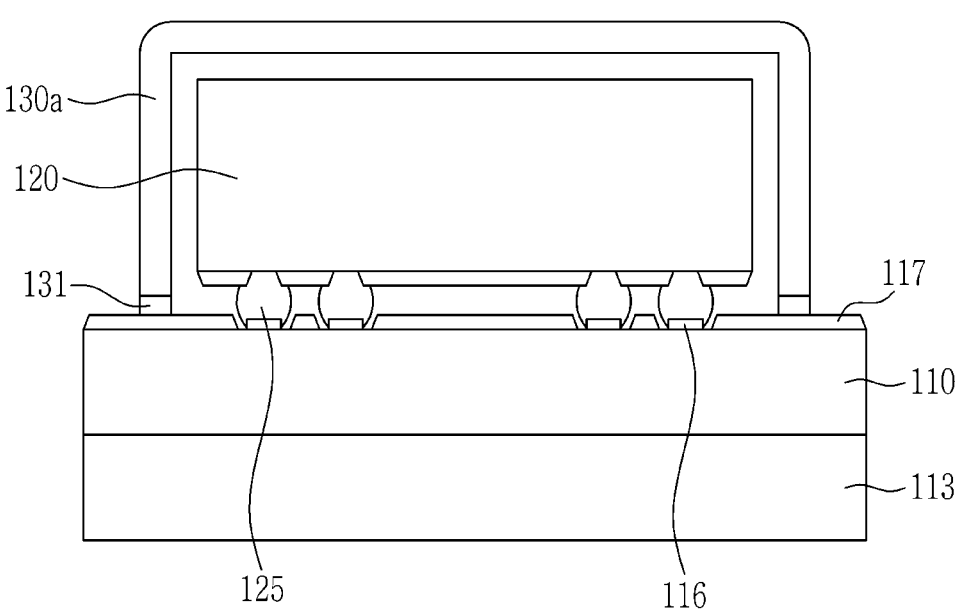
FIG. 9 illustrates a cross-sectional view of an operation of forming a plurality of first heat dissipation reinforcements on a substrate, as one of operations of a method for fabricating a semiconductor package according to an embodiment.

FIG. 9 illustrates a cross-sectional view of an operation of forming the plurality of first heat dissipation reinforcements 130*a* on the substrate 110, as one of operations of a method for fabricating a semiconductor package according to an embodiment.

Referring to FIG. 9, the plurality of first heat dissipation reinforcements 130*a* may be formed on the insulating layer 117 of the substrate 110. As an example, the plurality of first heat dissipation reinforcements 130*a* may be attached to the insulating layer 117 of the substrate 110 by using the adhesive layer 131. As another example, the plurality of first heat dissipation reinforcements 130*a* may be attached to a dummy metal pad of the substrate 110 through heat treatment. The plurality of first heat dissipation reinforcements 130*a* may be formed to surround the lateral surfaces and the upper surface of the semiconductor chip 120 at regular intervals from the lateral surfaces and the upper surface. Since the plurality of first heat dissipation reinforcements 130*a* are structures for discharging heat by improving the thermal conductivity of the semiconductor package 100, they may be electrically insulated from wire lines of the substrate 110 and the semiconductor chip 120.

Figure 10:
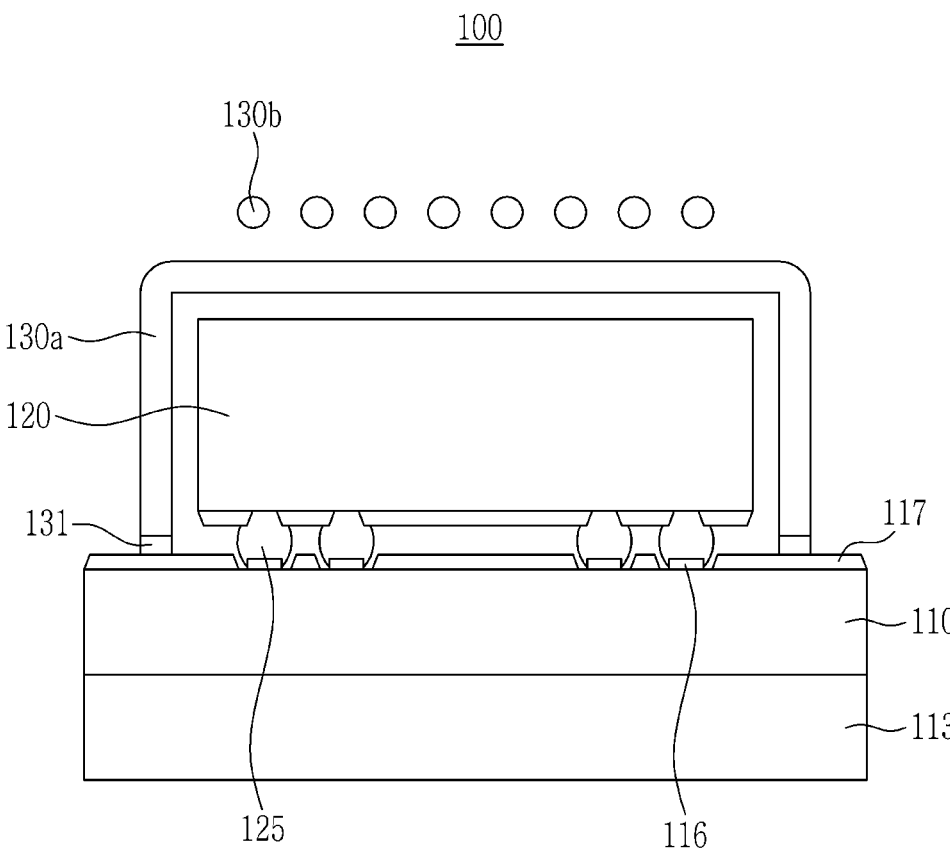
FIG. 10 illustrates a cross-sectional view of an operation of forming a plurality of second heat dissipation reinforcements crossing a plurality of first heat dissipation reinforcements formed on a substrate, as one of operations of a method for fabricating a semiconductor package according to an embodiment.

FIG. 10 illustrates a cross-sectional view of an operation of forming the plurality of second heat dissipation reinforcements 130*b* crossing the plurality of first heat dissipation reinforcements 130*a* formed on the substrate 110, as one of operations of a method for fabricating a semiconductor package according to an embodiment.

Referring to FIG. 10, the plurality of second heat dissipation reinforcements 130*b* may be formed on the insulating layer 117 of the substrate 110. As an example, the plurality of second heat dissipation reinforcements 130*b* may be attached to the insulating layer 117 of the substrate 110 by using the adhesive layer 131. As another example, the plurality of second heat dissipation reinforcements 130*b* may be attached to a dummy metal pad of the substrate 110 through heat treatment. The plurality of second heat dissipation reinforcements 130*b* may be formed to surround the lateral surfaces of the semiconductor chip 120 and the plurality of first heat dissipation reinforcements 130*a* at regular intervals from the lateral surfaces and the upper surface of the semiconductor chip 120. Since the plurality of second heat dissipation reinforcements 130*b* are structures for discharging heat by improving the thermal conductivity of the semiconductor package 100, they may be electrically insulated from wire lines of the substrate 110 and the semiconductor chip 120.

Figure 11:
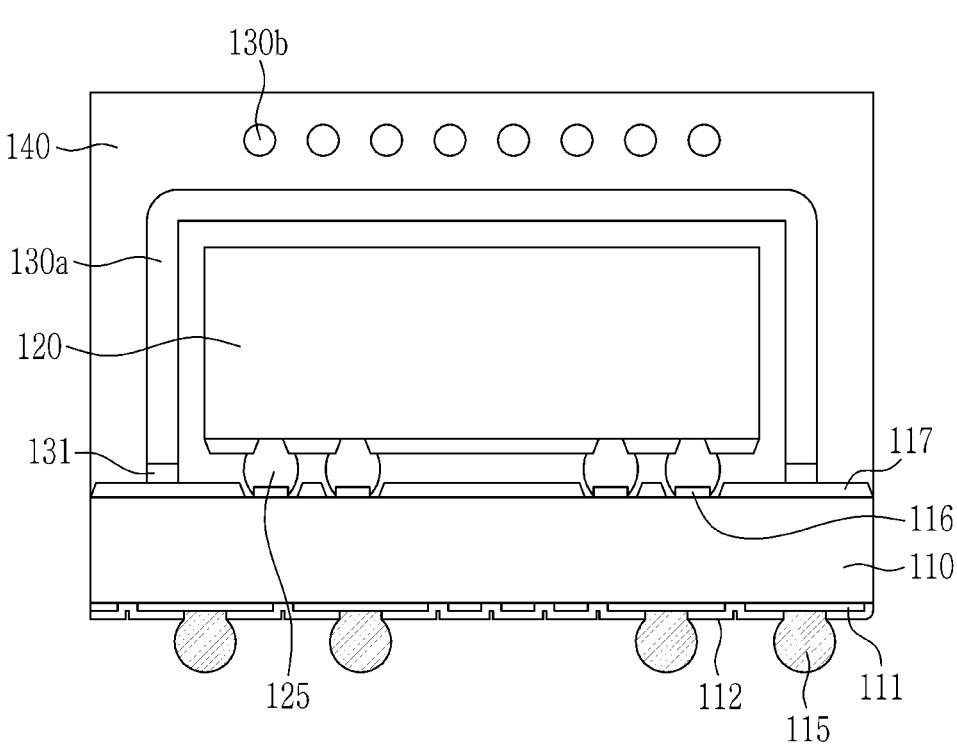
FIG. 11 illustrates a cross-sectional view of an operation of molding a semiconductor chip, a plurality of first heat dissipation reinforcements, and a plurality of second heat dissipation reinforcements, as one of operations of a method for fabricating a semiconductor package according to an embodiment.

FIG. 11 illustrates a cross-sectional view of an operation of molding the semiconductor chip 120, the plurality of first heat dissipation reinforcements 130*a*, and the plurality of second heat dissipation reinforcements 130*b* with the encapsulant 140, as one of operations of a method for fabricating a semiconductor package according to an embodiment.

Referring to FIG. 11, the semiconductor chip 120, the plurality of first heat dissipation reinforcements 130*a*, and the plurality of second heat dissipation reinforcements 130*b* may be molded with the encapsulant 140. In some embodiments, the process of molding with the encapsulant 140 may include a compression molding or transfer molding process. After molding the semiconductor chip 120, the plurality of first heat dissipation reinforcements 130*a*, and the plurality of second heat dissipation reinforcements 130*b* with the encapsulant 140, the carrier 113 may be debonded from the substrate 110, and the external connecting terminal 115 may be formed under the lower surface of the substrate 110.

Figure 12:
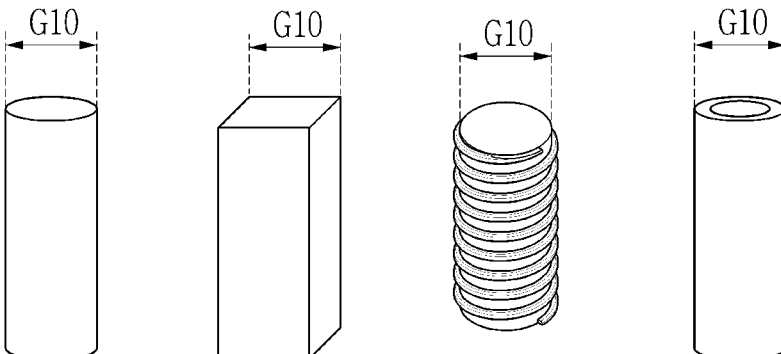
FIG. 12 illustrates perspective views of various shapes of a heat dissipation reinforcement in an embodiment.

FIG. 12 illustrates perspective views of various shapes of the heat dissipation reinforcement 130 of an embodiment.

Referring to FIG. 12, the heat dissipation reinforcement 130 may have a structure supporting the semiconductor package 100 inside the encapsulant 140. As examples, a shape of the heat dissipation reinforcement 130 may correspond to a spiral, a cylindrical, a hollow, a quadrangular, or a hexagonal cylinder shape. As an example, a cross-section of the heat dissipation reinforcement 130 cut in the circumferential direction may correspond to a circular shape, a rectangular shape, or a ring shape. As an example, the width G10 of the cross-section of the heat dissipation reinforcement 130 cut in the circumferential direction may be 0.1 um to 1000 mm. Due to the shape of the heat dissipation reinforcement 130 according to the present disclosure, the semiconductor chip 120 may be protected from external impact.

Figure 13:
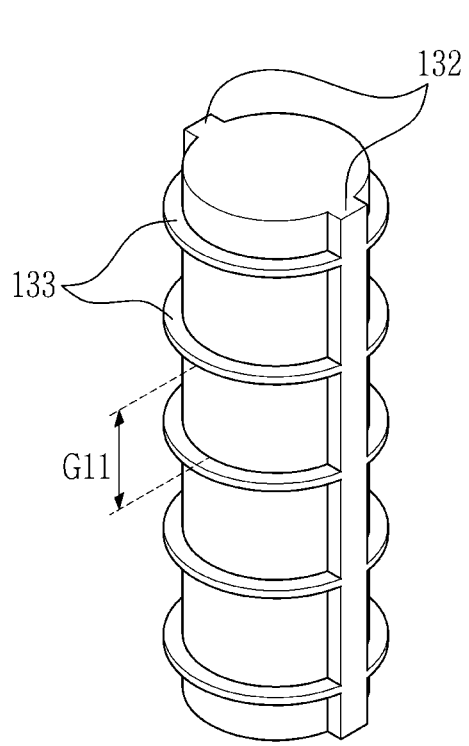
FIG. 13 illustrates a perspective view of a shape of a heat dissipation reinforcement to which protrusions are attached in an embodiment.

FIG. 13 illustrates a perspective view of a shape of the heat dissipation reinforcement 130 to which protrusions (extending in a longitudinal direction 132 and extending in a circumferential direction 133) are attached in an embodiment.

Referring to FIG. 13, the heat dissipation reinforcement 130 may have a structure in which a plurality of protrusions (extending in the longitudinal direction 132 and extending in the circumferential direction 133) are attached to improve adherence with the encapsulant 140 inside the encapsulant 140. As an embodiment, each of the plurality of protrusions (extending in the longitudinal direction 132 and extending in the circumferential direction 133) may extend in at least one of: the longitudinal direction 132, the circumferential direction 133, and a direction between the longitudinal direction 132 and the circumferential direction 133 of the heat dissipation reinforcement. As an example, each of the plurality of protrusions (extending in the longitudinal direction 132 and extending in the circumferential direction 133) may include at least one of: a spiral shape, a circular shape, a ring shape, and a straight shape.

FIG. 13 illustrates the shape in which the circular-shaped and straight-shaped protrusions are formed, but the disclosure is not limited thereto. As an example, a first protrusion of the plurality of protrusions (the circumferential direction 133) and a second protrusion of the plurality of protrusions (the circumferential direction 133) may have a predetermined interval G11. As an example, the interval G11 may be 0.001 mm to 1000 mm.

While the disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor package comprising:
a substrate;
a semiconductor chip on the substrate, the semiconductor chip comprising a first lateral surface, a second lateral surface opposite to the first lateral surface, and an upper surface connecting the first lateral surface and the second lateral surface;
a plurality of heat dissipation reinforcements on the substrate; and
an encapsulant, on the substrate, molding the semiconductor chip and the plurality of heat dissipation reinforcements,
wherein each of the plurality of heat dissipation reinforcements has an elongated shape, and continuously extends along the first lateral surface, the upper surface, and the second lateral surface of the semiconductor chip at a predetermined interval from the semiconductor chip.

2. The semiconductor package of claim 1, wherein a thermal conductivity of the plurality of heat dissipation reinforcements is greater than that of the encapsulant.

3. The semiconductor package of claim 1, wherein the plurality of heat dissipation reinforcements comprise copper, aluminum, gold, silver, iron, or stainless steel (SUS).

4. The semiconductor package of claim 1, wherein the elongated shape corresponds to at least one of a spiral, a cylindrical, a hollow, a quadrangular, and a hexagonal cylinder shape.

5. The semiconductor package of claim 1, wherein a shape of a cross-section of each of the plurality of heat dissipation reinforcements cut in a circumferential direction corresponds to a circular shape, a rectangular shape, or a ring shape.

6. The semiconductor package of claim 1, wherein each of the plurality of heat dissipation reinforcements comprises a plurality of protrusions.

7. The semiconductor package of claim 6, wherein each of the plurality of protrusions extends in at least one of: a longitudinal direction, a circumferential direction, and a direction between the longitudinal direction and the circumferential direction of the plurality of heat dissipation reinforcements.

8. The semiconductor package of claim 6, wherein a shape of each of the plurality of protrusions corresponds to at least one of: a spiral shape, a circular shape, a ring shape, and a straight shape.

9. The semiconductor package of claim 6, wherein a first protrusion of the plurality of protrusions has a predetermined interval with a second protrusion of the plurality of protrusions.

10. The semiconductor package of claim 1, wherein the encapsulant comprises an epoxy molding compound (EMC).

11. The semiconductor package of claim 1, wherein the plurality of heat dissipation reinforcements are electrically insulated from wire lines of the semiconductor chip and the substrate.

12. The semiconductor package of claim 1, wherein the semiconductor package is a wire bonding package, an RDL package, a flip chip package, a through silicon via (TSV) package, or a wafer level chip scale package (WLCSP).

13. A semiconductor package comprising:
a substrate comprising an insulating layer and a conductive layer;
a connecting member bonded to the conductive layer of the substrate;
a semiconductor chip provided on the substrate and bonded to the connecting member, the semiconductor chip comprising a first lateral surface, a second lateral surface opposite to the first lateral surface, and an upper surface connecting the first lateral surface and the second lateral surface;
a plurality of heat dissipation reinforcements bonded to the insulating layer of the substrate; and
an encapsulant, on the substrate, molding the connecting member, the semiconductor chip, and the plurality of heat dissipation reinforcements,
wherein each of the plurality of heat dissipation reinforcements has an elongated shape, and continuously extends along the first lateral surfaces, the upper surface, and the second lateral surface of the semiconductor chip at a predetermined interval from the semiconductor chip.

14. The semiconductor package of claim 13, wherein the plurality of heat dissipation reinforcements comprises a plurality of first heat dissipation reinforcements, and
wherein each of the plurality of first heat dissipation reinforcements comprises:
a first area extending along the first lateral surface of the semiconductor chip at a predetermined first interval from the first lateral surface;

a second area extending along a first direction parallel to the upper surface of the semiconductor chip at a predetermined second interval from the upper surface; and a third area extending along the second lateral surface of the semiconductor chip at a predetermined third interval from the second lateral surface.

15. The semiconductor package of claim 14, wherein the plurality of heat dissipation reinforcements comprises a plurality of second heat dissipation reinforcements, and wherein each of the plurality of second heat dissipation reinforcements comprises:

a fourth area extending along a third lateral surface connecting the first lateral surface and the second lateral surface of the semiconductor chip at a predetermined fourth interval from the third lateral surface;

a fifth area extending along a second direction parallel to the upper surface of the semiconductor chip and perpendicular to the first direction at a predetermined fifth interval from the upper surface of the semiconductor chip; and a sixth area extending along a fourth lateral surface opposite to the third lateral surface of the semiconductor chip at a predetermined sixth interval from the fourth lateral surface.

16. The semiconductor package of claim 13, wherein the plurality of heat dissipation reinforcements are bonded to the insulating layer of the substrate by an adhesive layer.

17. The semiconductor package of claim 13, wherein an interval between two adjacent heat dissipation reinforcements among the plurality of heat dissipation reinforcements is 0.001 mm to 1000 mm.

18. The semiconductor package of claim 13, wherein a width of a heat dissipation reinforcement among the plurality of heat dissipation reinforcements is 0.1 um to 1000 mm.

19. A method for fabricating a semiconductor package, comprising:

mounting a semiconductor chip on a substrate, the semiconductor chip comprising a first lateral surface, a second lateral surface opposite to the first lateral surface, and an upper surface connecting the first lateral surface and the second lateral surface;

forming, on the substrate, a plurality of heat dissipation reinforcements, the plurality of heat dissipation reinforcements continuously extending along the first lateral surfaces, the upper surface, and the second lateral surface of the semiconductor chip at a predetermined interval from the semiconductor chip and having an elongated shape; and molding the semiconductor chip and the plurality of heat dissipation reinforcements by using an encapsulant.

20. The semiconductor package of claim 19, wherein the molding of the semiconductor chip and the plurality of heat dissipation reinforcements by using the encapsulant corresponds to compression molding or transfer molding.

\* \* \* \* \*